United States Patent [19]

Tooley et al.

[11] Patent Number: 5,245,269
[45] Date of Patent: Sep. 14, 1993

[54] BATTERY TEMPERATURE SENSING APPARATUS

[75] Inventors: Thomas P. Tooley, Alpharetta; Andrew C. Zeik, Duluth, both of Ga.

[73] Assignee: NCR Corporation, Dayton, Ohio

[21] Appl. No.: 930,965

[22] Filed: Aug. 17, 1992

[51] Int. Cl.⁵ .............................................. H02J 7/04
[52] U.S. Cl. .......................................... 320/35; 320/2
[58] Field of Search ............................... 320/2, 35, 36

[56] References Cited

U.S. PATENT DOCUMENTS

| | | | |
|---|---|---|---|
| 3,609,505 | 9/1971 | Harland, Jr. et al. | 320/35 |
| 4,616,171 | 10/1986 | Hernandez et al. | 320/35 X |
| 4,727,306 | 2/1988 | Misak et al. | 320/35 |
| 5,070,427 | 12/1991 | Bush | 320/36X |

FOREIGN PATENT DOCUMENTS

| | | | |
|---|---|---|---|
| 2716862 | 10/1977 | Fed. Rep. of Germany | 320/35 |
| 0069777 | 6/1981 | Japan | 320/35 |

Primary Examiner—Kristine L. Peckman
Attorney, Agent, or Firm—Albert L. Sessler, Jr.; Richard W. Lavin

[57] ABSTRACT

An apparatus for controlling the charging voltage applied to a battery cell includes a printed circuit board having a flexible portion comprising a heat sensitive material which is wrapped around the battery cell for sensing the temperature of the battery cell during charging of the battery cell. Circuit means connected to said temperature battery apparatus disables the charging voltage upon the temperature of the battery cell reaching a predetermined level and generates a trickle charge in response to the disabling of the charging voltage.

5 Claims, 4 Drawing Sheets 5,245,269

BATTERY TEMPERATURE SENSING APPARATUS

BACKGROUND OF THE INVENTION

The present invention relates to hand-held computer terminals and more particularly to hand-held, battery powered computer terminals or the like.

A recent development in data terminal devices has been the introduction of hand-held data terminal devices which are used in data collection and inventory control where the portability of the terminal device is required. Such terminal devices utilize batteries for the power supply. In such battery-operated devices, fast-charging techniques are utilized to reduce the down time that the terminal device is subjected to. In the use of such fast-charging operations, temperature monitoring is critical to prevent cell damage and to provide reliability of the power supply. After reaching a full charge, a battery cell will continue to absorb energy which is turned into heat which may damage the battery cells associated with the power supply. Monitoring the temperature is a much more reliable indicator of a fully-charged battery cell than monitoring the over-voltage condition of the cell. However, accurate and reliable temperature monitoring schemes have been impractical due to cost considerations.

It is therefore a principal object of this invention to provide an apparatus for monitoring the condition of a charging battery cell to indicate the start of an overcharged condition.

It is another object of this invention to provide a battery-temperature sensing apparatus which can be incorporated within the circuitry of a hand-held data processing device.

It is a further object of this invention to provide a battery temperature sensing device which utilizes a flexible portion of a printed circuit board mounted within a portable hand-held data terminal device.

It is a further object of this invention to provide a battery temperature sensing apparatus which is simple in construction and low in cost.

SUMMARY OF THE INVENTION

In order to fulfill these objects, there is provided a printed circuit board mounted within a hand-held housing member comprising a data processing device having a flexible portion which is wrapped around the battery cells associated with the power supply of the data processing device. The flexible portion transmits the heat generated by the charging battery cells to a sensing circuit which senses the temperature of the battery cells during a fast charging operation and generates signals when the temperature of the battery cell rises to a predetermined value. The sensing circuit will generate signals in response to sensing such predetermined value for disabling the charging of the battery cells replacing the charging current with a trickle charge.

BRIEF DESCRIPTION OF THE DRAWINGS

The foregoing and various other objects, advantages and meritorious features of the present invention will be apparent from the following detailed description and appended claims when read in conjunction with the drawings, wherein like numerals identify corresponding elements.

DESCRIPTION OF THE PREFERRED EMBODIMENT

Figure 1:
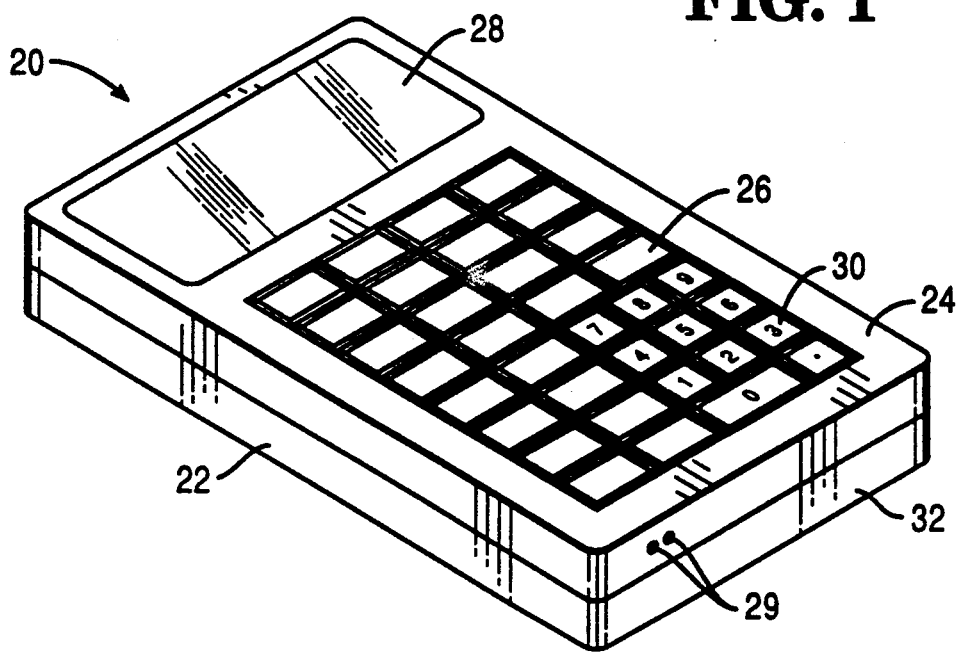
FIG. 1 is a perspective view of a hand-held data processing device in which the present invention is incorporated.

Referring now to FIG. 1, there is shown a perspective view of the portable hand-held data processing device generally indicated by the numeral 20 which includes a housing member 22 having a keyboard portion 24 comprising a plurality of key members 26 including a ten-key portion 30 and further includes a display portion 28 in which data is displayed in response to the actuation of the key members 26 and 30. Mounted in the end portion 32 of the housing member 22 are a pair of terminals 29 which may be connected to an external battery charging system or power pack for charging the battery cells of the power supply of the data processing device.

Figure 2:
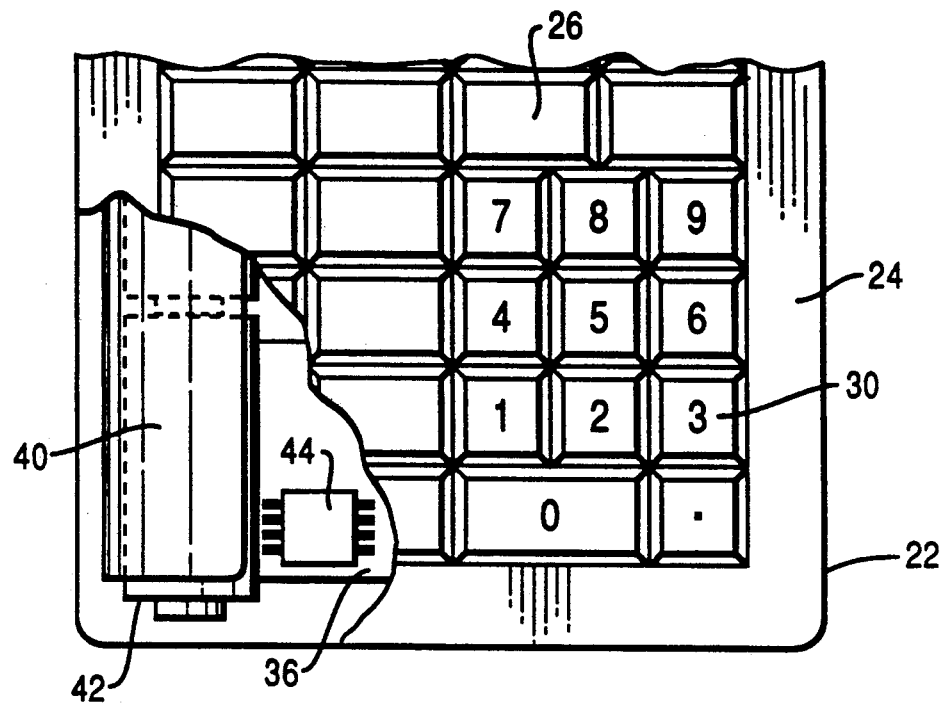
FIG. 2 is a partial top view of the data processing device in which a portion of the top surface of the device is removed showing the flexible portion of the printed circuit board wrapped around a pair of battery cells comprising the power supply for the processing device.
Figure 3:
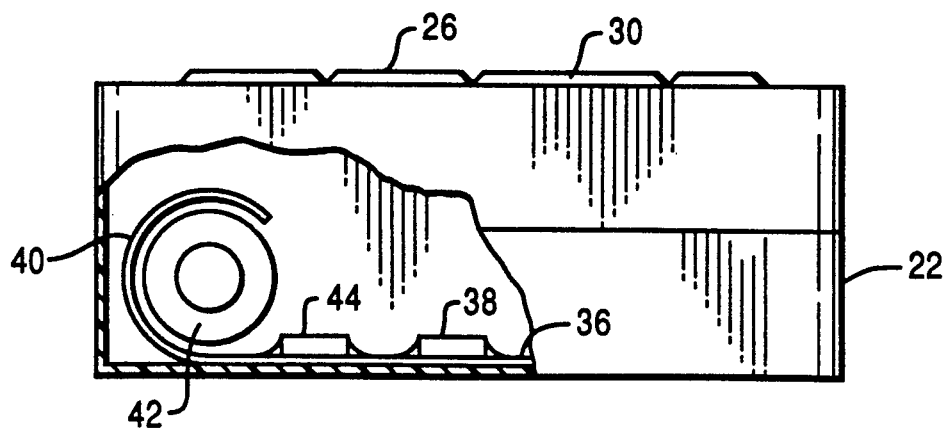
FIG. 3 is an end view of the data processing device with a portion of the rear surface removed showing a portion of the printed circuit board and the circuit chips mounted thereon and an end view of the battery cells with the flexible portion of the printed circuit board wrapped around the battery cells.

Referring now to FIGS. 2 and 3, there are shown partial top and end views of the terminal device 20 with a portion of the keyboard 24 removed showing details of the present invention. Mounted within the terminal device 20 is a printed circuit board 36 which includes a plurality of integrated circuit elements 38 (FIG. 3) and 44 (FIG. 2) mounted to the top surface of the printed circuit board 36. One end of the printed circuit board comprises a flexible portion 40 which is wrapped around a pair of battery cells 42 which supply power to the printed circuit board. As will be described more fully hereinafter, the flexible portion 40 comprising a solid copper foil element will transmit the heat generated by the battery cells 42 during a fast charging operation to a temperature sensing integrated circuit chip 44 located on the printed circuit board 36. As the temperature of the battery cells 42 rises during the charging operation, the integrated chip 44 will output a voltage whose value increases as the temperature increases.

Figure 5:
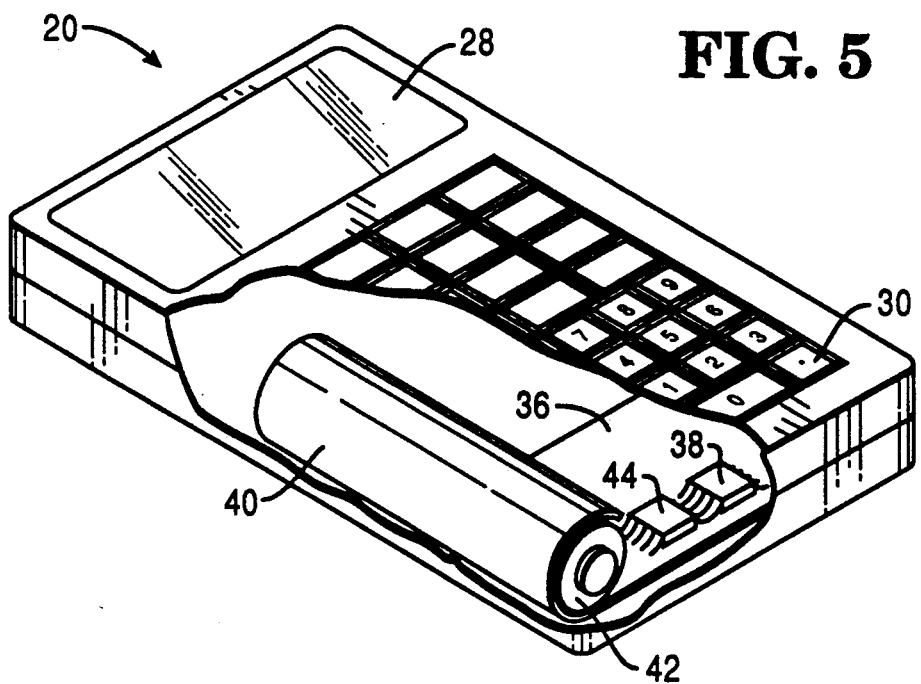
FIG. 5 is a perspective view of the data processing device similar to FIG. 1 with a portion of the housing member removed showing the mounting of the flexible portion on the battery cells together with the printed circuit board and circuit chips located thereon.
Figure 4A:
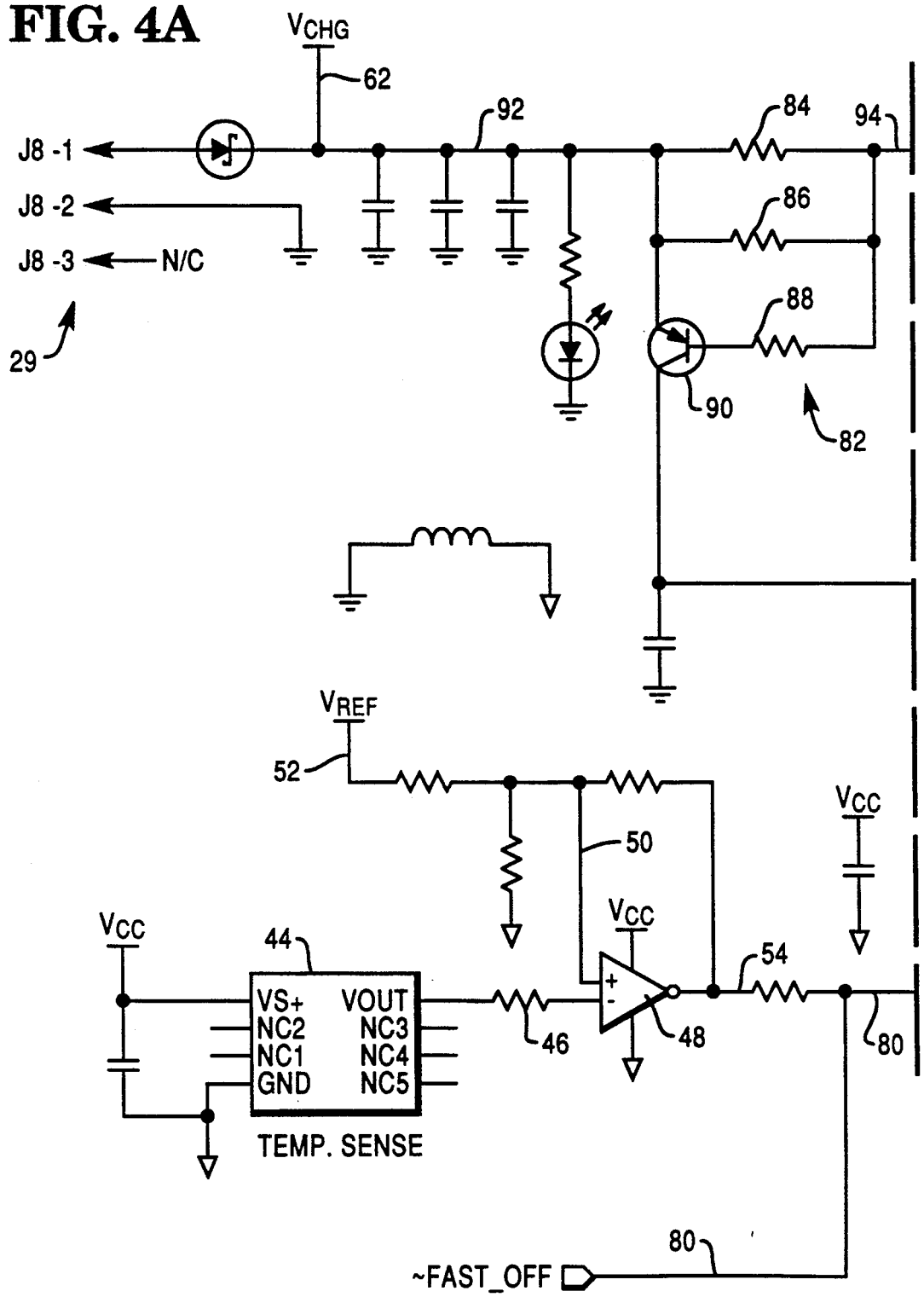
FIGS. 4A and 4B taken together form a schematic diagram of a charging circuit for controlling the charging operation of the battery cells.
Figure 4B:
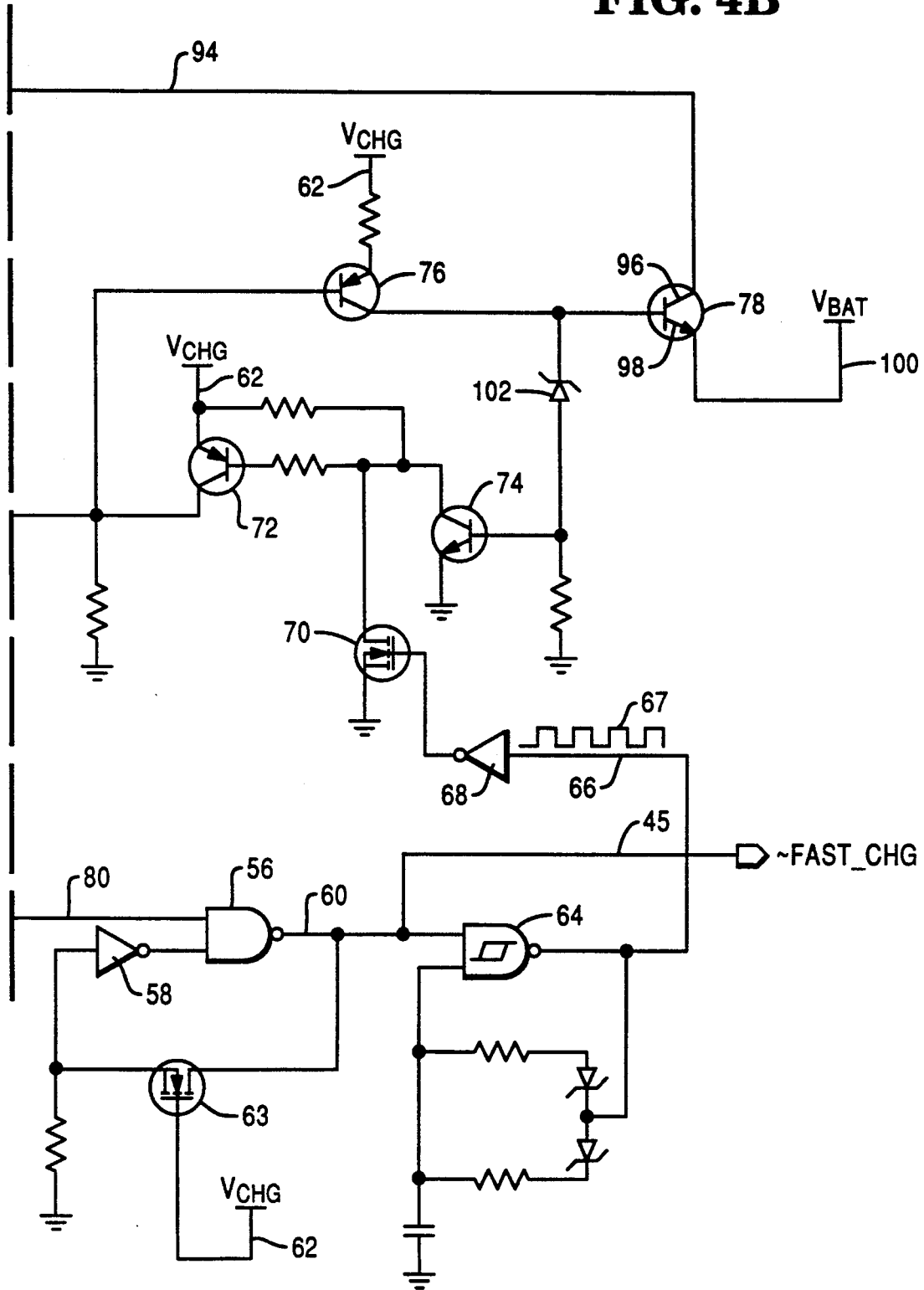

Referring now to FIGS. 4A and 4B, there is disclosed a schematic diagram of a charging circuit for generating a fast charge operation of the battery cells 42. The circuit is enabled by the appearance of a charging voltage $V_{chg}$ appearing on line 62 (FIG. 4B) and the signal FAST-OFF appearing on line 80 (FIG. 4A) being high. The charging voltage may be provided by any type of DC power source such as a wall transformer. Included in the circuit in the illustrated embodiment is a National Semiconductor LM35DM temperature sensing integrated circuit chip 44 (FIG. 4A) mounted on the printed circuit board 36 adjacent the flexible portion 40 (FIGS. 2, 3 and 5) which senses the heat transmitted through the flexible circuit portion 40 from the battery cells 42. In response to sensing the temperature in the flexible portion 40, the temperature sensing circuit chip 44 will generate a voltage signal across the resistor 46 to one input of a comparator circuit 48 which compares the received voltage with a reference voltage generated over line 50 from a voltage source 52.

Once the input of the comparator 48 reaches the reference voltage indicating that the battery cells are fully charged, the comparator circuit 48 will output a low voltage signal over lines 54 and 80 to one input of a NAND gate 56 (FIG. 4B) which also receives a low signal from an inverter 58. The output signal appearing on line 60 is transmitted into one input of an oscillator 64 enabling the oscillator to output over line 66 a train of pulses 67 which are inverted by the inverter 68 and transmitted to the base of a field effect transistor 70. The transistor 70 is part of the charging circuit which includes the transistors 70–78 inclusive. The train of pulses 67 appearing on line 66 are generated for the reason that the battery cells 42 ($V_{BAT}$) are initially being fast charged with a constant current over line 100 (FIG. 4B) which builds up the temperature in the battery cells. Once the constant current fast charge is disabled by the generation of the signal FAST_OFF over line 80 (FIG. 4A), the temperature of the battery cells will again drop disabling the operation of the comparator circuit 48. In order to prevent this condition from re-enabling the constant current fast charge, a field effect transistor 63 (FIG. 4B) is included. Once a high signal appears on line 60, the transistor 63 will latch the NAND gate 56 to output a high signal over line 60. The signal on line 60 will remain high as long as $V_{chg}$ is present over line 62. The generation of the train of pulses 67 (FIG. 4B) appearing on line 66 will function as a trickle charge enabling a portion of the charging circuit, indicated by the numeral 82 (FIG. 4A), to provide an oscillating current output over line 100 to the battery cells 42 without the chance of an overcharged condition occurring. This construction eliminates the problem of temperature fall off until the power pack is disconnected.

The charging network further includes the resistors 84–88 inclusive and the transistor 90 (FIG. 4A). The power pack voltage $V_{CHG}$ will insert a DC voltage over lines 62 and 92 into the resistors 84, 86 and across the transistor 90 which sets up a constant current source. The current flowing through the transistor will generate a voltage drop across resistors 84–86 and over line 94, through the collector 96 of the transistor 78 (FIG. 4B) enabling the transistor to output over the emitter 98 a charging voltage over line 100 to the battery cells 42 ($V_{BAT}$). The transistor 78 will output 500 milliamps of current over line 100 to the battery cells 42. A Zener diode 102 limits the maximum output voltage on the emitter 98 to 4.5 volts thus disabling the transistor should an over voltage condition occur in the battery cells.

The pulses 67 appearing on line 66 will enable the field effect transistor 70 to transmit the pulses through the transistors 72 and 76 to the transistor 78 enabling the emitter 98 to output the pulsed current over line 100. It will be seen that by applying a constant fast charging current to the battery cells, the temperature will rise until the temperature sensing circuit chip 44 will enable the NAND gate 64 (FIG. 4B) to output the pulses 67 over line 66 resulting in the pulsed current applied by the battery charger producing a trickle charge on the battery cells. This arrangement prevents any damage being done to the battery cells as a result of overcharging the cells. The positioning of the flexible portion 40 of the printed circuit board around the battery cells provides a low cost and effective apparatus for controlling the charging of the battery cells.

While the salient features of the invention have been illustrated and described, it should be readily apparent to those skilled in the art that many changes and modifications can be made in the invention presented without departing from the spirit and true scope of the invention. Accordingly, the present invention should be considered as encompassing all such changes and modifications of the invention that fall within the broad scope of the invention as defined by the claims.

What is claimed:

1. In an electronic device having a printed circuit board and a battery cell mounted adjacent thereto as a power supply for circuitry of the printed circuit board, an apparatus for sensing an overcharging condition of the battery cell comprising:

means secured to the printed circuit board for sensing the heat generated by the battery during a fast charging operation, said heat sensing means comprising a flexible portion of the printed circuit board wrapped around the battery cell for transmitting the heat generated by the battery cell during the fast charging of the battery cell to circuit means; and the circuit means located on the printed circuit board coupled to said heat sensing means for disabling the fast charging of the battery cell upon the battery cell generating a predetermined temperature representing a full charge level of the battery cell.

2. The apparatus of claim 1 in which the flexible portion of the printed circuit board comprises a sheet of copper foil.

3. The apparatus of claim 1 in which the circuit means includes means for generating a voltage signal in accordance with the temperature of the heat of the battery cell; and comparator means coupled to said generating means for comparing a signal level of said voltage signal with a reference signal representing the maximum charging level of the battery cell whereby the comparator means will generate a control signal which disables the fast charging of the battery cell when the voltage signal level reaches the reference signal level.

4. The apparatus of claim 3 in which the circuit means includes oscillator means coupled to said comparator means for generating a series of equal level signals, said oscillator means controlling the circuit means to provide a trickle charge on the battery cell in response to the generation of the control signal.

5. In an electronic device having a printed circuit board and a battery cell mounted adjacent thereto as a power supply for circuitry of the printed circuit board, said battery cell being chargeable from an external source, an apparatus for sensing an overcharging condition of the battery cell comprising:

a flexible portion of the printed circuit board comprising a heat sensitive material which is positioned around the battery for transmitting the heat generated by the battery during a charging operation to the printed circuit board; and circuit means located on the printed circuit board coupled for sensing the temperature of the heat transmitted by the flexible portion, said circuit means disabling the charging of the battery cell upon the battery cell generating a predetermined temperature representing a full charge level of the battery cell, said circuit means further generating a trickle charge for keeping the battery cell charged at a predetermined level without overcharging the battery cell in response to the disabling of the charging of the battery cell.

* * * * *